(12) United States Patent  (10) Patent No.: US 7,772,051 B2
Lo  (45) Date of Patent: Aug. 10, 2010

(54) MOS DEVICES WITH CORNER SPACERS

(75) Inventor: Cheng-Yao Lo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/354,527

(22) Filed: Jan. 15, 2009

(65) Prior Publication Data

US 2009/0176344 A1   Jul. 9, 2009

Related U.S. Application Data

(63) Continuation of application No. 11/435,438, filed on May 16, 2006, now Pat. No. 7,495,280.

(51) Int. Cl.
*H01L 21/00* (2006.01)
*H01L 21/84* (2006.01)

(52) U.S. Cl. .......................... 438/149; 257/E21.409

(58) Field of Classification Search ............. 438/149, 438/303; 257/E21.409
See application file for complete search history.

(56) References Cited

U.S. PATENT DOCUMENTS

| | | | | |
|---|---|---|---|---|
| 5,290,720 | A * | 3/1994 | Chen ........................ | 438/304 |
| 5,541,132 | A | 7/1996 | Davies et al. | |
| 6,144,071 | A | 11/2000 | Gardner et al. | |
| 6,251,764 | B1 | 6/2001 | Pradeep et al. | |
| 6,281,062 | B1 * | 8/2001 | Sanchez .................... | 438/217 |
| 6,632,714 | B2 | 10/2003 | Yoshikawa | |
| 6,664,156 | B1 * | 12/2003 | Ang et al. .................. | 438/229 |
| 7,064,071 | B2 | 6/2006 | Schwan | |
| 2002/0127763 | A1 * | 9/2002 | Arafa et al. .................. | 438/76 |
| 2003/0011080 | A1 | 1/2003 | Deshpande et al. | |
| 2003/0020111 | A1 | 1/2003 | Bevan | |
| 2004/0212009 | A1 | 10/2004 | Wang et al. | |
| 2005/0064722 | A1 | 3/2005 | Hsu et al. | |
| 2005/0112817 | A1 * | 5/2005 | Cheng et al. ................ | 438/219 |
| 2005/0266639 | A1 | 12/2005 | Frohberg et al. | |
| 2006/0099763 | A1 * | 5/2006 | Liu et al. .................... | 438/299 |
| 2006/0151840 | A1 | 7/2006 | Maekawa | |
| 2006/0157752 | A1 * | 7/2006 | Suzuki ....................... | 257/288 |
| 2006/0205169 | A1 | 9/2006 | Yoon et al. | |

(Continued)

OTHER PUBLICATIONS

Augendre, E., et al., "Thin L-shaped spacers for CMOS devices," IEEE, 2003, pp. 219-222.

*Primary Examiner*—Kiesha R Bryant
*Assistant Examiner*—Igwe U Anya
(74) *Attorney, Agent, or Firm*—Slater & Matsil, L.L.P.

(57) ABSTRACT

A MOS device having corner spacers and a method for forming the same are provided. The method includes forming a gate structure overlying a substrate, forming a first dielectric layer over the gate structure and the substrate, forming a second dielectric layer on the first dielectric layer, forming a third dielectric layer on the second dielectric layer, and etching the first, the second and the third dielectric layers using the third dielectric layer as a mask. The remaining first and second dielectric layers have an L-shape. The method further includes implanting source/drain regions, removing remaining portions of the third dielectric layer, blanket forming a fourth dielectric layer, etching the fourth dielectric layer, siliciding exposed source/drain regions, and forming a contact etch stop layer. The remaining portion of the fourth dielectric layer forms corner spacers.

14 Claims, 6 Drawing Sheets

U.S. PATENT DOCUMENTS

| | | |
|---|---|---|
| 2006/0216899 A1* | 9/2006 | Chen .......................... 438/301 |
| 2006/0220152 A1 | 10/2006 | Huang et al. |
| 2007/0023822 A1 | 2/2007 | Sung et al. |
| 2007/0026541 A1* | 2/2007 | Kokura .......................... 438/7 |
| 2007/0034963 A1* | 2/2007 | Sudo .......................... 257/369 |
| 2007/0122958 A1* | 5/2007 | Fang .......................... 438/197 |
| 2007/0218633 A1 | 9/2007 | Prinz et al. |

\* cited by examiner

MOS DEVICES WITH CORNER SPACERS

This application is a continuation application of U.S. application Ser. No. 11/435,438, now U.S. Pat. No. 7,495,280 filed on May 16, 2006, entitled "MOS Devices with Corner Spacers," which application is hereby incorporated herein by reference.

TECHNICAL FIELD

This invention relates generally to semiconductor devices, and more particularly to the structure and fabrication methods of MOS devices, and even more particularly to a method of forming spacers.

BACKGROUND

Spacers are key elements in modern metal-oxide-semiconductor (MOS) devices. They provide several key functions. Besides insulating gate electrodes and source/drain regions, they are also used as implant masks for implanting source and drain regions and forming silicide regions.

Typically, spacers are formed by blanket depositing a dielectric layer after the formation of gate electrodes, forming and patterning a photo resist on the dielectric layer, and etching undesired portions of the dielectric layer. Remaining portions of the dielectric layer, typically including vertical portions on the sidewalls of the gate electrodes and possibly small horizontal portions adjacent the vertical portions, become spacers.

Since significant portions of spacers are vertical, conventional single layer spacers suffer non-uniformity problems. Also, over-hang takes place at the top corners of the spacers. These problems are further worsened by the scaling of the integrated circuits. Higher performance requirements in small-scaled integrated circuits demand thinner spacers, and any non-uniformity and/or over-hang significantly affects the profiles of the spacers, and hence the uniformity of MOS devices on a semiconductor chip.

To solve the above-discussed problems, composite spacers have been developed. One of the most commonly used composite spacers has an oxide-nitride-oxide (ONO) structure. FIGS. 1A through 1F illustrate a conventional formation process of a MOS device having spacers with an ONO structure. In FIG. 1A, a stacked layer comprising an oxide layer 4, a nitride layer 6 and an oxide layer 8 is formed, followed by the deposition of a polysilicon layer 10 over gate electrode 2. FIG. 1B illustrates the patterning of polysilicon layer 10. In FIG. 1C, the remaining polysilicon portions act as mask layers, and the unmasked portions of the oxide layer 8, nitride layer 6, and oxide layer 4 are removed. Referring to FIG. 1D, remaining portions of polysilicon layer 10 and oxide layer 8 are removed, and an oxide layer 14 is formed. A mask (not shown) is then formed, and unmasked portions of the oxide layer 14 are removed, forming spacer portions 16, as shown in FIG. 1E.

Spacers having an ONO structure typically have a lower aspect ratio than single-layer structures; thus subsequent gap filling processes are easier.

MOS devices formed using the previously discussed steps generally exhibit good performance when fabricated using 90 nm technology or beyond. However, when MOS devices are scaled down to 65 nm and below, they begin to suffer drawbacks. Referring to FIG. 1F, MOS devices formed at 65 nm and below have very shallow junctions. Thus the distance $D_1$ between silicide regions 17 and the respective junction borders is small. This results in current crowding effects, and thus the drive current of the resulting MOS device is adversely affected. Additionally, source/drain leakage current, which is symbolized by arrow 19, becomes significant due to the short leakage current path.

Another problem associated with the conventional ONO structure is that the stress applied by stressed etch stop layer 18 is reduced. Typically, the stress applied to the channel region of the MOS device is inversely related to a distance $D_2$ between the stressed etch stop layer 18 and the channel region of the MOS device. A large spacer portion 16 increases the distance $D_2$, and thus decreases the stress applied by the stressed etch stop layer 18.

What is needed, therefore, is a new spacer scheme eliminating the above-discussed problems while at the same time preserving the advantageous features of the composite spacers.

SUMMARY OF THE INVENTION

The preferred embodiments of the present invention provide a MOS device having corner spacers for improved performance and a method for forming the same.

In accordance with one aspect of the present invention, the MOS device includes a gate structure overlying a substrate, a sidewall spacer on a sidewall of the gate structure wherein the sidewall spacer is L-shaped having a vertical leg and a horizontal leg, a corner spacer having a first portion adjacent an edge of the horizontal leg of the sidewall spacer, a source/drain region substantially aligned with the edge of the horizontal leg of the sidewall spacer, and a silicide region substantially aligned with an outer edge of the corner spacer. The MOS device further includes a stressed contact etch stop layer.

In accordance with another aspect of the present invention, the method for forming the preferred embodiments of the present invention includes forming a gate structure overlying a substrate, forming a first dielectric layer over the gate structure and the substrate, forming a second dielectric layer on the first dielectric layer, forming a third dielectric layer on the second dielectric layer, and etching the first, the second and the third dielectric layer using the third dielectric layer as a mask. The remaining first and second dielectric layers have an L-shape. The method further includes implanting source/drain regions, removing the remaining third dielectric layer, blanket forming a fourth dielectric layer, etching the fourth dielectric layer, siliciding exposed source/drain regions, and forming a contact etch stop layer. The remaining portions of the fourth dielectric layer form corner spacers.

The corner spacers space the silicide regions apart from the edge of the source/drain regions, thus reducing current crowding effects and leakage current. With a smaller spacer on the horizontal leg of the spacer, greater stress is imparted to the channel region of the MOS device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention are illustrated. Variations of the preferred embodiment are then discussed. Throughout the various views and illustrative embodiments of the present invention, like reference numbers are used to designate like elements.

Figure 2:
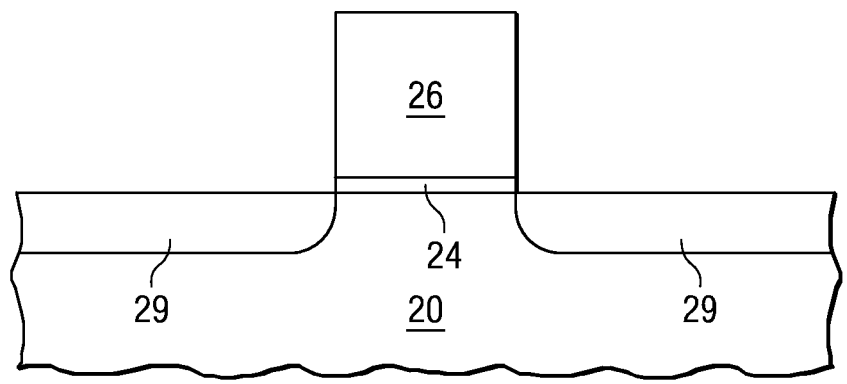
FIGS. 2 through 10 are cross-sectional views of intermediate stages in the manufacture of a MOS device having corner spacers.

FIG. 2 illustrates a gate stack, which comprises a gate dielectric 24 and a gate electrode 26, formed on a substrate 20. Gate dielectric 24 preferably has a high dielectric constant (k value). Substrate 20 may be a bulk silicon substrate, although other commonly used materials and structures such as silicon on insulator (SOI) can also be used.

Lightly doped drain (LDD) regions 29 are formed, preferably by implanting impurities of appropriate types. Using the gate electrode 26 as a mask, LDD regions 29 are substantially aligned with the edges of the gate electrode 26.

Figure 3:
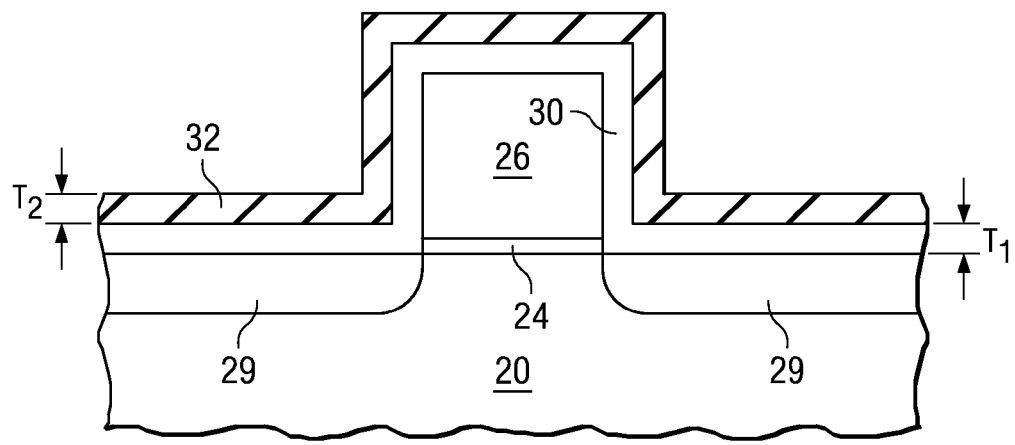

Referring to FIG. 3, an inner oxide layer 30, sometimes referred to as a liner oxide layer 30, is blanket formed, followed by the deposition of a nitride layer 32. The inner oxide layer 30 is preferably formed using a method such as plasma enhanced chemical vapor deposition (PECVD), low-pressure chemical vapor deposition (LPCVD), sub-atmospheric chemical vapor deposition (SACVD), and the like. The inner oxide layer 30 preferably comprises commonly used oxides such as silicon oxide, hafnium oxide, titanium oxide, aluminum oxide, tin oxide, zinc oxide, and the like. When formed using 65 nm technology, inner oxide layer 30 preferably has a thickness $T_1$ of between about 50 Å and about 500 Å. One skilled in the art will realize that if smaller-scale technologies are used, the preferred dimensions of inner oxide layer 30 and other features throughout the description will be down-scaled accordingly.

Nitride layer 32 is then formed on the inner oxide layer 30. Nitride layer 32 preferably comprises nitride materials such as silicon nitride, silicon oxynitride (SiON), titanium nitride, cadmium nitride, and the like, and is preferably formed using commonly used methods such as PECVD, LPCVD, SACVD, and the like. The preferred thickness $T_2$ of the nitride layer 32 is between about 50 Å and about 500 Å.

Figure 4:
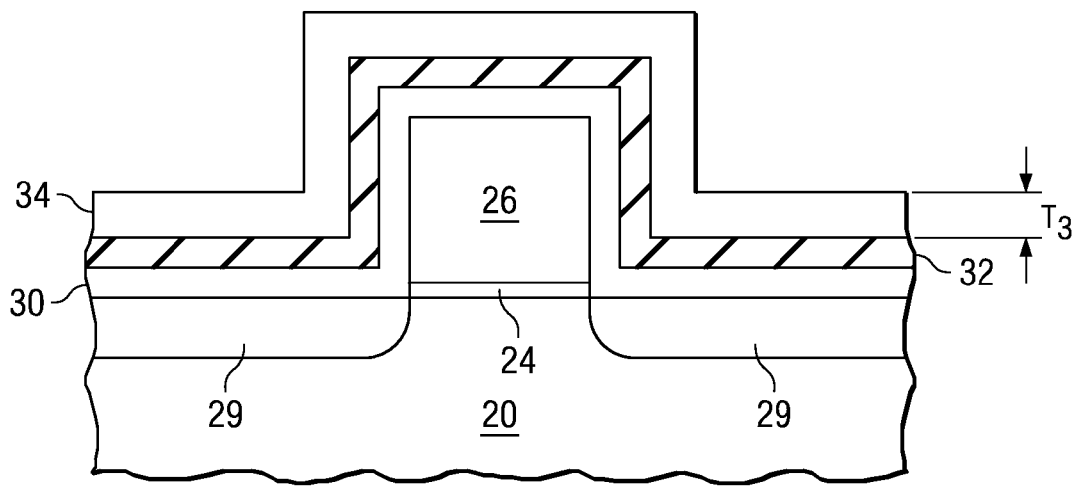

FIG. 4 illustrates the formation of an outer oxide layer 34, which is preferably formed using similar materials and similar methods as the inner oxide layer 30, although different materials and/or methods can be used. Outer oxide layer 34 has a preferred thickness $T_3$ of between about 50 Å and about 500 Å. More preferably, the thickness $T_3$ is greater than the thickness $T_2$.

In the preferred embodiment, oxide, nitride and oxide are used for forming layers 30, 32 and 34, respectively. In other embodiments, a nitride-oxide-nitride structure or other like structures can be used, providing that layer 32 has a relatively high etching selectivity from layers 30 and 34.

Next, anisotropic dry etches are performed, preferably using plasma etching. In the preferred embodiment, three etches are performed sequentially, each using a reactant gas selectively attacking one of the outer oxide layer 34, nitride layer 32 and oxide inner layer 30. In an exemplary embodiment, outer oxide layer 34, inner oxide layer 30 and nitride layer 32 are etched using plasma etching. In the preferred embodiment, no mask layer is formed, and, since outer oxide layer 34 has vertical portions, which have remaining portions even if all of the horizontal portions have been etched out, the remaining vertical portions act as a mask for etching the underlying nitride layer 32 and inner oxide layer 30. Preferably, end-point mode is used, and when an end point for etching horizontal portions of each layer is detected, the etching stops.

Figure 5:
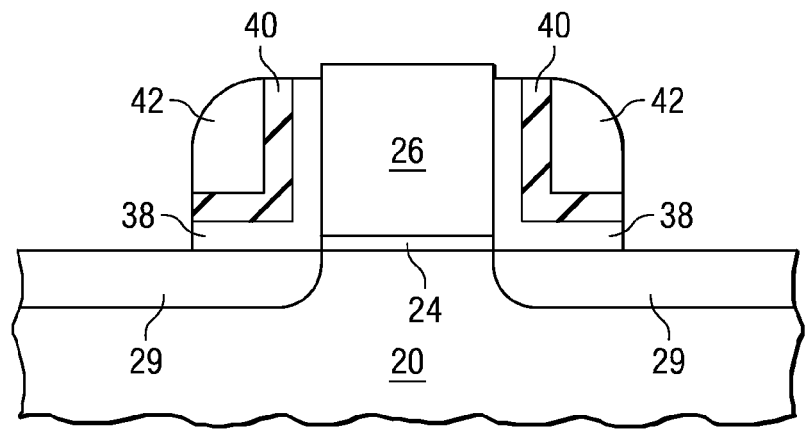

FIG. 5 illustrates a structure formed by dry etch, which includes spacer portions 38, 40 and 42. Since the vertical portions of the outer spacer layer 34 have a substantially great thickness, after the horizontal portions have been etched, significant portions 42 still remain. By carefully controlling end-point detection, it can be ensured that outer oxide portions 42 will remain. The remaining portions of the inner oxide layer 30 and nitride layer 32 form spacer portions 38 and 40, respectively.

Figure 6:
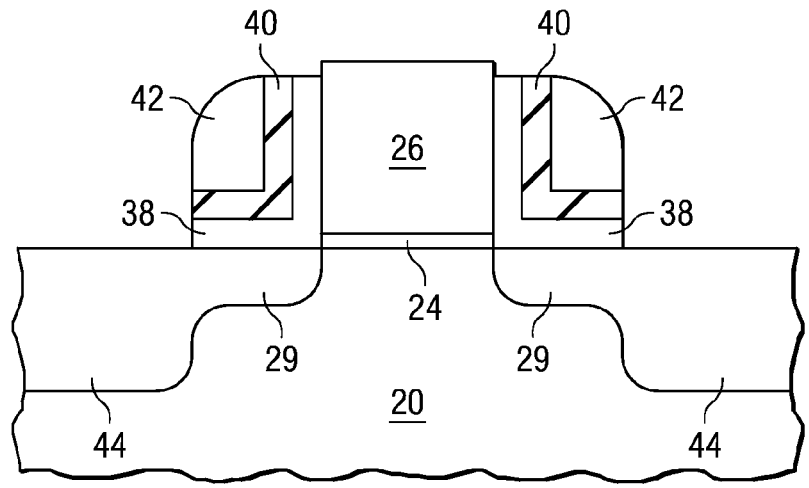

FIG. 6 illustrates the formation of source/drain regions 44. Due to the masking of the spacer portions 38, 40 and 42, the source/drain regions 44 are substantially aligned with the respective edges of the spacer portions 38, 40 and 42. Spacer portions 38, 40 and 42 are at times referred to as a single sidewall spacer, as these features preferably function as a single spacer unit.

Figure 7:
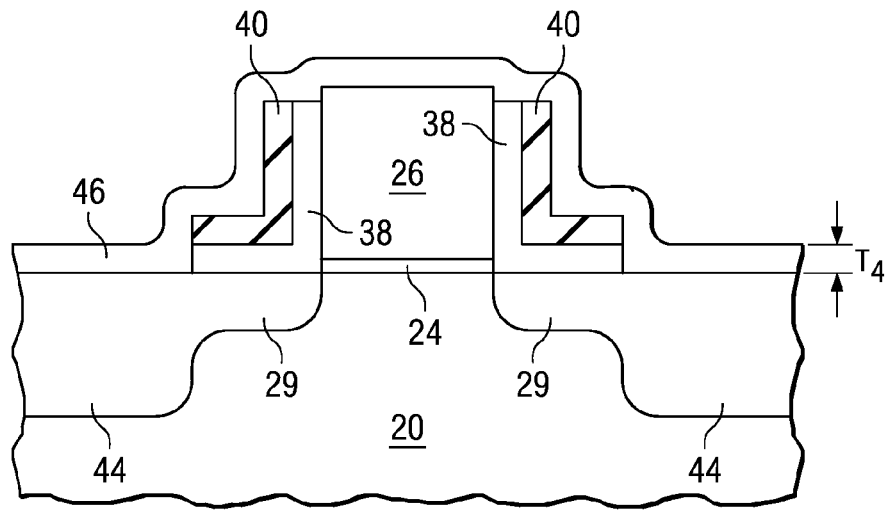

Referring to FIG. 7, outer oxide portions 42 are substantially removed, preferably by using an isotropic wet etch, for example, in diluted hydrofluoric acid. Inner spacer portions 38 are protected by the nitride spacer portions 40. A corner spacer layer 46 is then blanket deposited. In the preferred embodiment, the corner spacer layer 46 is preferably formed of an oxide, such as silicon oxide, hafnium oxide, titanium oxide, and the like. In other embodiments, nitrides such as silicon nitride, silicon oxynitride, titanium nitride, and cadmium nitride can be used. The preferred method of deposition includes PECVD, LPCVD, SACVD, and other commonly used methods. The thickness $T_4$ of corner spacer layer 46 is preferably between about 100 Å and about 1000 Å.

Figure 8A:
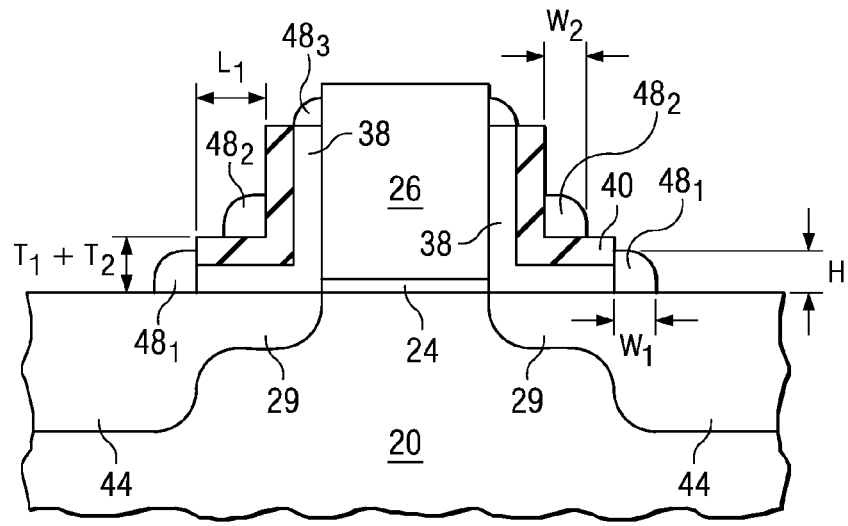

Corner spacer layer 46 is then etched, preferably anisotropically, as shown in FIG. 8A. In the preferred embodiment, no mask is formed for the etching of corner spacer layer 46. Non-continuous corner spacers 48, which may include portions $48_1$, $48_2$ and $48_3$, are formed, wherein portions $48_1$ are on source/drain regions 44, portions $48_2$ are on the horizontal legs of the spacer portions 40, and portions $48_3$ are on the vertical legs of the spacer portions 38 and 40. Preferably, the height H of the spacer portions $48_1$ is equal to or smaller than the combined thickness ($T_1+T_2$) of the spacer portions 38 and 40, and the width $W_2$ of the spacer portions $48_2$ is equal to or smaller than the length L of the horizontal leg of the spacer portions 38 and 40. As will be discussed in subsequent paragraphs, corner spacer portions $48_1$ help reduce leakage current and current crowding effect. Therefore, the width $W_1$ of the corner spacer portions $48_1$ is preferably greater than about 100 Å. When formed using 90 nm technology and below, the height H and width $W_1$ and $W_2$ of the corner spacers 48 are preferably less than about 2000 Å, and more preferably between about 100 Å and about 500 Å.

In an exemplary embodiment, corner spacer layer 46 is dry etched using end-point mode. When an end point is detected, the etching process is preferably continued for an extension time, for example, ten seconds, to continue reducing the size of the corner spacers 48. The optimum extension time can be determined through routine experimentation. In an exemplary embodiment, the extension time is between about 3 seconds and about 30 seconds.

Figure 8B:
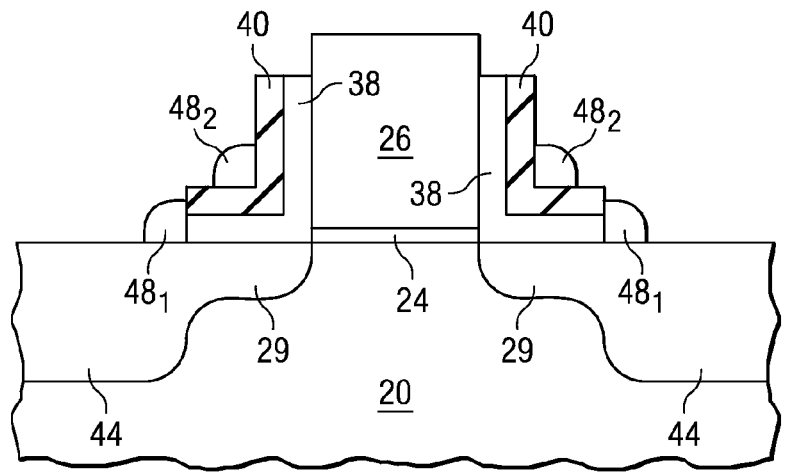
Figure 8C:
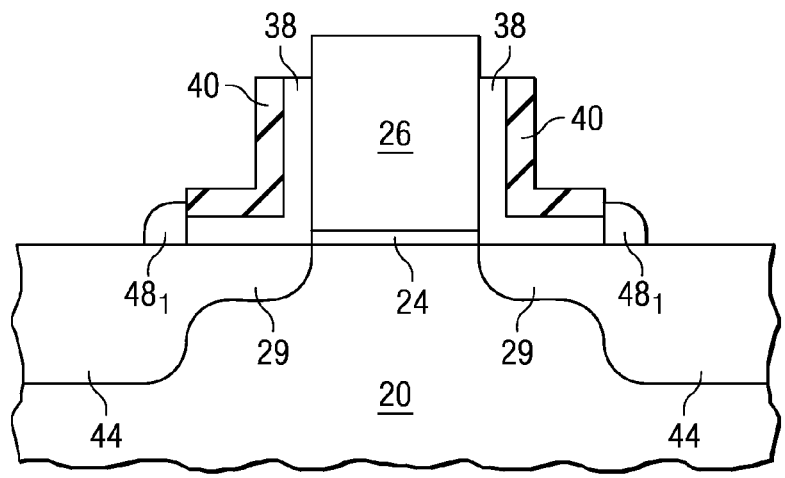

FIGS. 8B and 8C illustrate variations of the preferred embodiment, wherein different combinations of corner spacer portions $48_1$, $48_2$ and $48_3$ are formed. In FIG. 8B, only corner spacer portions $48_1$ and $48_2$ are formed. In FIG. 8C, only corner spacer portions $48_1$ are formed. These variations are likely the results of process variations, which occur from wafer to wafer due to inaccurately controlled process conditions, although in the preferred embodiment, at least both portions $48_1$ and $48_2$ are formed.

Figure 9:
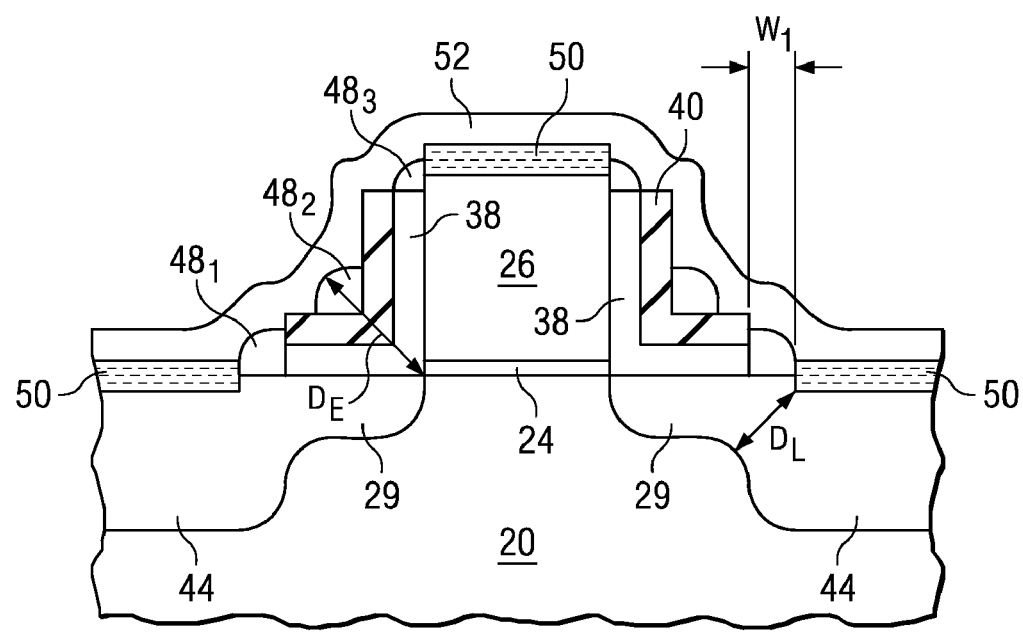

Referring to FIG. 9, a silicidation is performed, forming silicide regions 50. Silicide regions 50 may comprise metals such as titanium, cobalt, nickel, palladium, platinum, erbium, and the like. As is known in the art, the silicidation is preferably performed by blanket deposition of an appropriate metal layer, followed by an annealing step in which the metal reacts with underlying exposed silicon. Un-reacted metal is then removed, preferably with a selective etch process. Preferably, silicide regions 50 are also formed on the top of the gate electrode 26 if the gate electrode 26 comprises silicon.

FIG. 9 also illustrates the formation of a contact etch stop layer (CESL) 52. In the preferred embodiment, the CESL 52 is formed of silicon nitride and provides a stress to the underlying regions. CESL 52 may be formed using techniques such as plasma enhanced chemical vapor deposition (PECVD), low pressure CVD (LPCVD), and other appropriate techniques.

In FIG. 9, it is observed that by forming corner spacers 48, the preferred embodiments of the present invention have the effect of shifting the silicide regions 50 away from the channel region by a distance $W_1$, which is the width of the spacer portions $48_1$. The distance $D_L$ between the silicide regions 50 and the nearest junction border of the source/drain regions 44 is thus increased. As a result, the current crowding effects are reduced and the device drive current is improved. A further advantageous feature is that the leakage current flowing between silicide regions 50 and substrate 20 is reduced due to the increased distance $D_L$.

It is also noted that corner portions $48_2$ are small. Thus the distance $D_E$ between the channel region of the resulting MOS device and the CESL 52 is reduced. Higher stress, therefore, is imparted to the channel region even though the inherent stress in CESL 52 stays the same.

Figure 10:
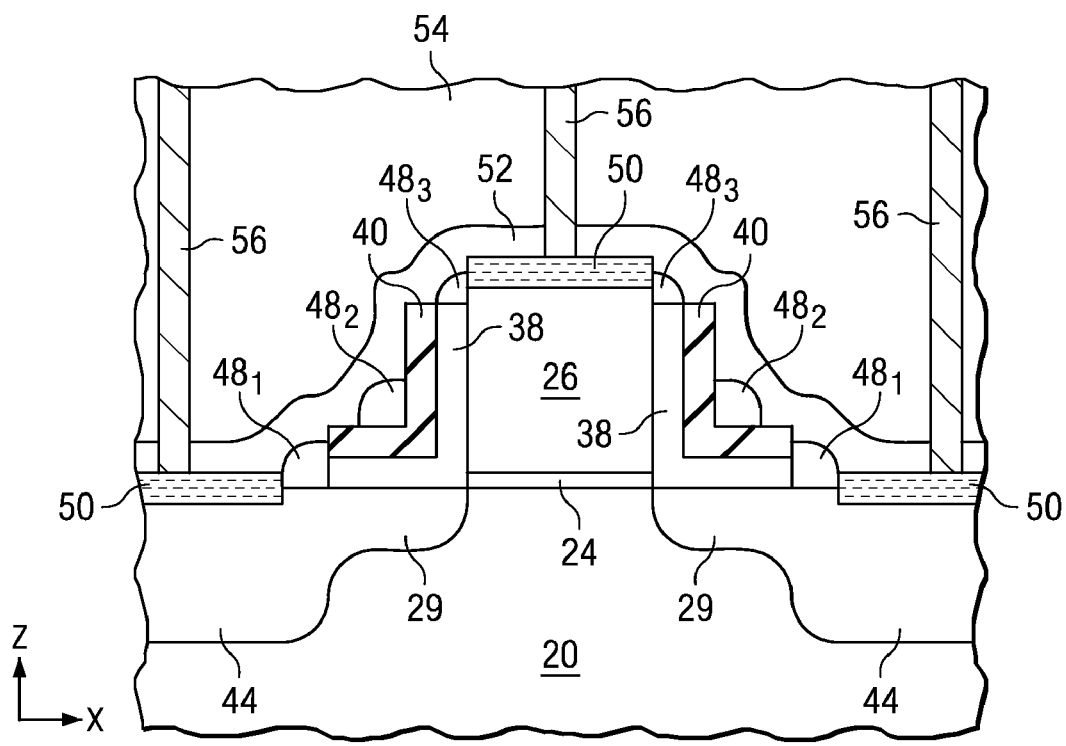

FIG. 10 illustrates the gap-filling and contact formation process. An inter-layer dielectric (ILD) 54 is formed on CESL 52. ILD 54 is preferably silicon dioxide deposited using, e.g., CVD, PECVD, LPCVD, or other well-known deposition techniques. ILD 54 provides insulation between the MOS device and overlying metal lines. Since the formation of corner spacers 48 results in the reduction of the slope (or aspect ratio) of the entire spacer, the filling of the inter-layer dielectric layer may be performed with less difficulty.

Contact openings are then formed in the ILD 54. Note that CESL 52 operates as an etch stop layer during the etching of ILD 54 and thus protects the underlying silicide regions 50. Next, the exposed portions of CESL 52 in the contact openings are etched. Because CESL 52 is quite thin relative to ILD 54, process control and end-point detection are controlled more precisely, thus limiting the likelihood of over-etching through the underlying silicide regions 50. The contact openings are then filled to form contacts 56.

Figure 1A:
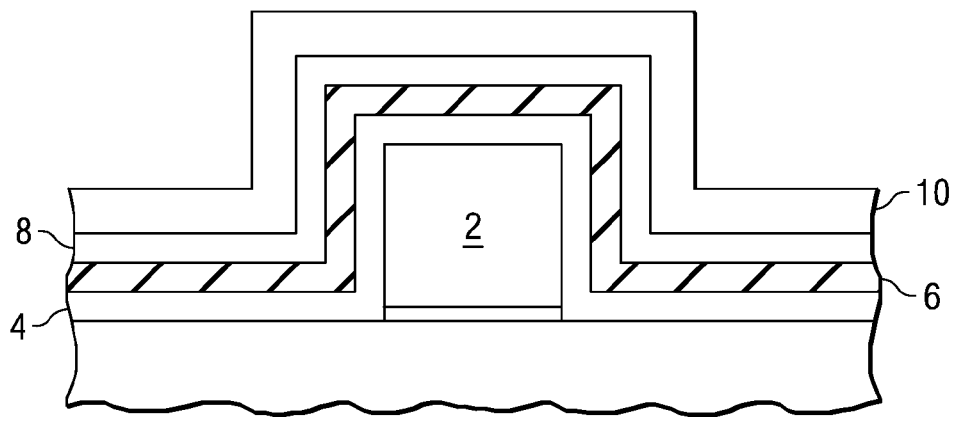
FIGS. 1A through 1F illustrate a conventional method for forming composite spacers with an L-shape.
Figure 1B:
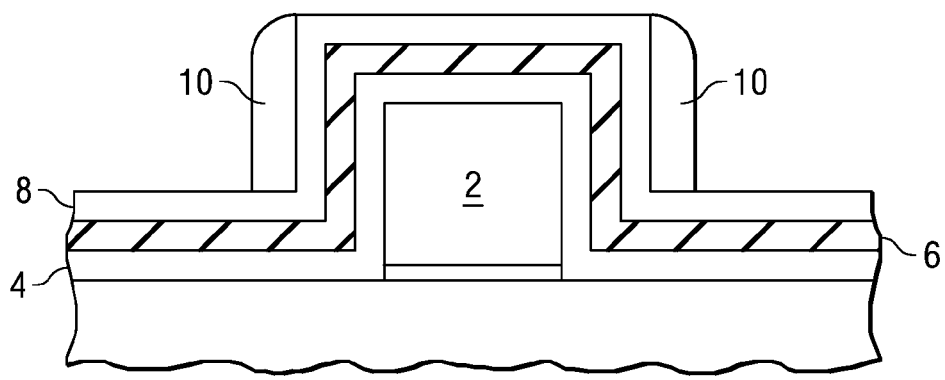
Figure 1C:
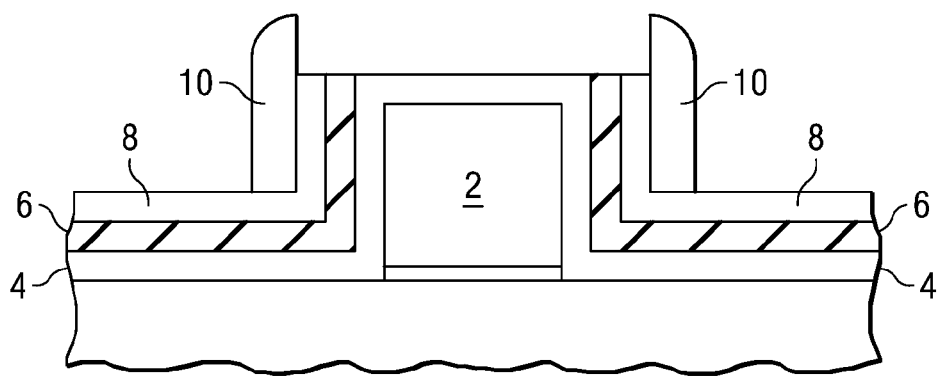
Figure 1D:
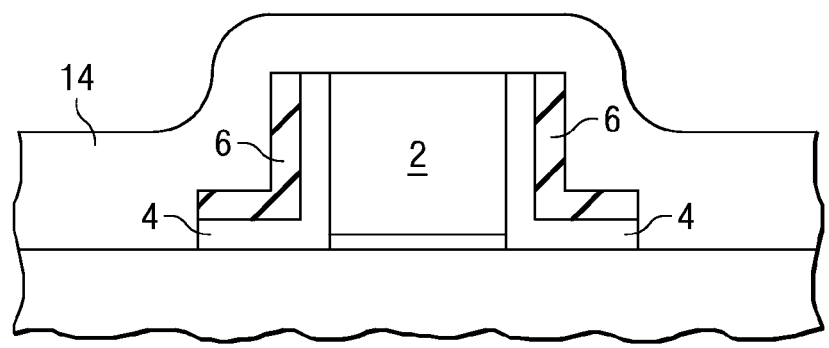
Figure 1E:
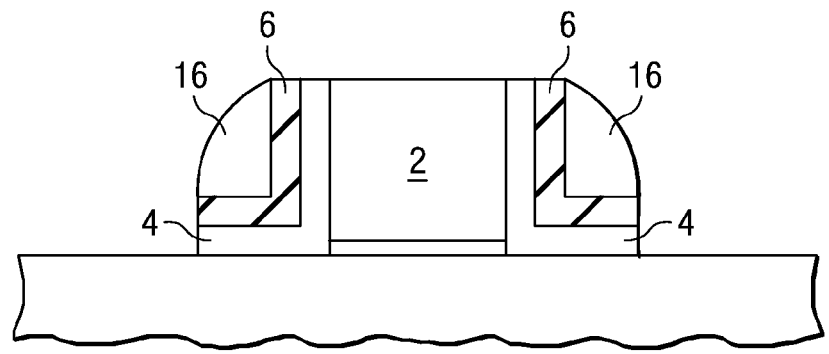
Figure 1F:
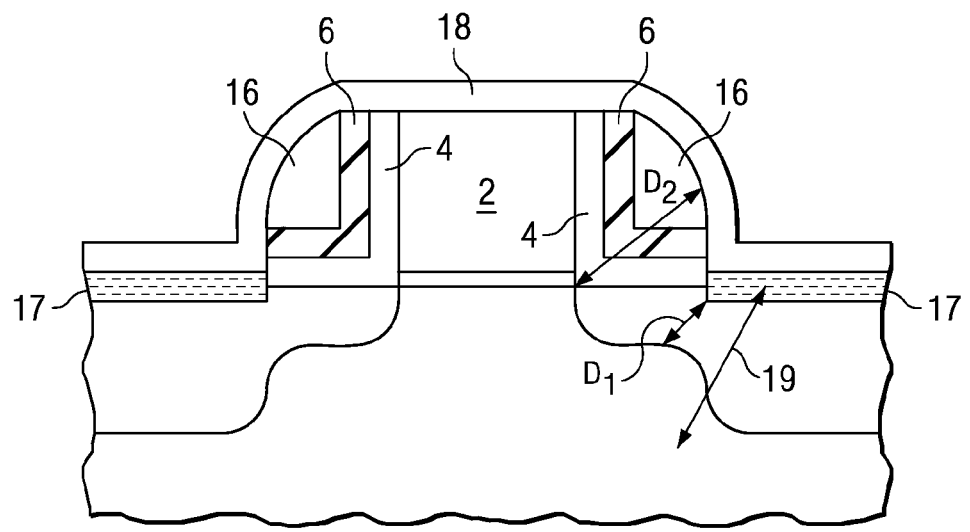

Simulation results have shown that the preferred embodiments of the present invention have improved stress in the channel region. If a CESL layer having 1 GPa stress is formed on a prior art MOS device, which has a structure as shown in FIG. 1F, a 98 MPa stress in channel length direction X and a −7.7 MPa stress in the direction Z (refer to FIG. 10), which is perpendicular to the wafer plane, have been shown in the simulation results. When the same CESL is formed on a preferred embodiment of the present invention, stresses of 154 MPa in the X direction and −21 MPa in the Z direction have been shown. Therefore, both tensile stress in direction X and compressive stress in direction Z are strengthened, and performance of NMOS devices is improved. If a compressive CESL is formed, it will be found that compressive stress in direction X and tensile stress in direction Z will be strengthened. The performance of PMOS devices, therefore, can be improved accordingly.

The preferred embodiments of the present invention have several advantageous features. Since the outer oxide layer 34 is used as a mask for the etching of the spacers, one photo mask and the corresponding lithography steps are saved. Device performance is improved due to reduced drain/source leakage current, reduced current crowing effects in source/drain regions and increased stress in the channel region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a metal-oxide-semiconductor (MOS) device, the method comprising:
   providing a substrate;
   forming a gate structure overlying the substrate;
   forming a sidewall spacer on a sidewall of the gate structure, wherein the sidewall spacer has an L-shape and comprises a vertical leg and a horizontal leg;
   forming a corner spacer comprising:
      a first portion on the substrate and adjacent an outer edge of the horizontal leg of the sidewall spacer;
      a second portion on top of the vertical leg of the sidewall spacer, wherein the first portion and the second portion of the corner spacer are disconnected;
   forming a source/drain region substantially vertically aligned with an interface between the sidewall spacer and the first portion of the corner spacer; and
   forming a silicide region substantially aligned with an outer edge of the first portion of the corner spacer.

2. The method of claim 1, wherein the step of forming the source/drain region is performed after the step of forming the sidewall spacer and before the step of forming the corner spacer.

3. The method of claim 1, wherein the step of forming the silicide region is performed after the step of forming the corner spacer.

4. The method of claim 1, wherein the corner spacer further comprises a third portion on the horizontal leg and adjacent to the vertical leg of the sidewall spacer, wherein the first portion, the second portion, and the third portion of the corner spacer are disconnected from each other.

5. The method of claim 1, wherein the step of forming the corner spacer comprises:
   forming a dielectric layer over the sidewall spacer; and
   etching the dielectric layer without using a mask to cover portions of the dielectric layer.

6. The method of claim 1, wherein the step of forming the sidewall spacer comprises:
   forming an oxide layer; and
   forming a nitride layer over the oxide layer, wherein the corner spacer is formed of nitride.

7. The method of claim 6, wherein the step of forming the sidewall spacer further comprises:
   forming an additional oxide layer over the nitride layer;
   performing an anisotropic etching to the additional oxide layer, so that a remaining portion of the addition oxide layer remains on a horizontal leg of the nitride layer; and
   after the step of forming the source/drain region and before the step of forming the corner spacer, removing the remaining portion of the addition oxide layer.

8. A method for forming a metal-oxide-semiconductor (MOS) device, the method comprising:
   providing a substrate;
   forming a gate structure overlying the substrate;
   forming an inner oxide layer over the gate structure and the substrate;
   forming a first nitride layer on the inner oxide layer;
   forming an outer oxide layer on the first nitride layer;
   etching the outer oxide layer, the first nitride layer, and the inner oxide layer using the outer oxide layer as a mask so that the inner oxide layer and the first nitride layer form a sidewall spacer having an L-shape with a vertical leg and a horizontal leg, and the outer oxide layer has a remaining portion on the horizontal leg of the first nitride layer;
   implanting the substrate to form a source/drain region;
   removing the remaining portion of the outer oxide layer;
   blanket forming a second nitride layer;
   etching the second nitride layer, wherein a remaining portion of the second nitride layer forms non-continuous corner spacers having at least one of a first portion and a second portion, and wherein the first portion is on the substrate and adjacent an edge of the horizontal leg of the sidewall spacer, and the second portion is on the horizontal leg and adjacent the vertical leg of the sidewall spacer; and
   siliciding the source/drain region.

9. The method of claim 8, wherein the step of etching the outer oxide layer, the first nitride layer, and the inner oxide layer comprises plasma etching, and the step of etching the second nitride layer comprises dry etchings.

10. The method of claim 8, wherein an end point mode is used in the step of etching the outer oxide layer, the first nitride layer, and the inner oxide layer for detecting end points.

11. The method of claim 8, wherein the step of etching the second nitride layer comprises detecting an end point of the etching and continuing etching for an extension time after the end point is detected.

12. The method of claim 11, wherein the extension time is between about 3 seconds and about 30 seconds.

13. The method of claim 8, wherein the non-continuous corner spacers further comprise a third portion on the vertical leg of the first oxide layer.

14. The method of claim 8 further comprising, after the step of siliciding, blanket forming a contact etch stop layer.

* * * * *

UNITED STATES PATENT AND TRADEMARK OFFICE
CERTIFICATE OF CORRECTION

PATENT NO. : 7,772,051 B2  Page 1 of 1
APPLICATION NO. : 12/354527
DATED : August 10, 2010
INVENTOR(S) : Lo It is certified that error appears in the above-identified patent and that said Letters Patent is hereby corrected as shown below:

In Col. 7, line 15, claim 7, delete "addition" and insert --additional--.
In Col. 7, line 19, claim 7, delete "addition" and insert --additional--.

Signed and Sealed this

Fourteenth Day of September, 2010

David J. Kappos
*Director of the United States Patent and Trademark Office*